United States Patent [19]

Vig

[11] 3,981,687

[45] Sept. 21, 1976

[54] METHOD OF TREATING QUARTZ CRYSTAL RESONATORS

[75] Inventor: John R. Vig, Colts Neck, N.J.

[73] Assignee: The United States of America as represented by the Secretary of the Army, Washington, D.C.

[22] Filed: May 8, 1975

[21] Appl. No.: 575,854

[52] U.S. Cl. ............................ 29/25.35; 21/DIG. 2; 250/492 B
[51] Int. Cl.² ......................................... H01L 41/22
[58] Field of Search ............... 29/25.35; 250/492 R, 250/453, 492 B; 21/DIG. 2; 310/8.2, 8.9

[56] References Cited
UNITED STATES PATENTS

| | | | |
|---|---|---|---|
| 2,383,262 | 8/1945 | Kuenstler | 250/492 |
| 2,437,912 | 3/1948 | Frondel | 29/25.35 |
| 3,149,232 | 9/1964 | Jaffe et al. | 250/492 |
| 3,766,616 | 10/1973 | Standte | 29/25.35 |

*Primary Examiner*—Carl E. Hall
*Attorney, Agent, or Firm*—Nathan Edelberg; Roy E. Gordon; Sheldon Kanars

[57] ABSTRACT

The aging and thermal hysteresis of quartz crystal resonators are reduced by hermetically sealing the quartz crystal resonator in a housng including a material transparent to radiation capable of polymerizing contaminants, and irradiating the resonator with radiation capable of polymerizing contaminants.

14 Claims, No Drawings

METHOD OF TREATING QUARTZ CRYSTAL RESONATORS

The invention described herein may be manufactured, used, and licensed by or for the Government for governmental purposes without the payment to me of any royalty thereon.

BACKGROUND OF THE INVENTION

This invention relates in general to a method of treating quartz crystal resonators, and in particular to a method of reducing the aging and thermal hysteresis of quartz crystal resonators.

By aging as the term is used herein is meant the change in the resonance frequency of the quartz crystal resonator with time. Similarly, the term thermal hysteresis refers to the change in resonance frequency of the quartz crystal resonator due to a temperature change from the original temperature followed by a return to the original temperature.

As is well established in the art, and as used herein, the term quartz crystal resonator refers to a quartz plate that has been mounted in clips, the clips bonded to the quartz, and electrodes deposited on the quartz by plating in a vacuum system. Following the various processing steps, a contaminating layer is left on the resonator such as carbonaceous contaminants due to backstreaming from an oil diffusion pump, outgassing of the chamber, residues from electroplating, etc. In current practice, the quartz crystal resonator is then sealed in some housing or enclosure. Such sealing also causes contamination due to the flux used in solder sealing and the outgassing of the walls during heating. Even when stringent measures have been taken to eliminate the most obvious sources of contamination such as flux and oil vapors, it is well known in vacuum science that a clean surface exposed to air will absorb monolayers of contamination within a fraction of a second. Even in a vacuum of $10^{-6}$ Torr, a monolayer of contamination can form in about one second. It is therefore virtually impossible to maintain atomically clean surfaces during processing.

The surface contamination can lead to aging and thermal hysteresis by several known mechanisms. To illustrate this point, one can consider a 5 megahertz fundamental mode resonator sealed hermetically in ultra high vacuum. If contamination equivalent to a single atomic layer of quartz desorbed from the surface of this resonator, the frequency would change by about 3 parts per million. If a monolayer desorbed from the enclosure walls as well, and if the desorbed contaminants remained in the enclosure in gaseous form, the pressure in the enclosure would rise to over 100 microns. Contamination also has a major influence on the electrode adhesion, and on the stresses at the electrode-quartz interface.

The aging caused by the contamination prevents the resonators from being used in modern communications and navigation systems which require highly stable resonators. For example, a stability of 2 parts in $10^{10}$ per week is required by one such system. Presently, the equipment required for processing resonators in an ultraclean, ultrahigh vacuum system in which the resonator is not exposed to contaminating atmospheres is extremely expensive and difficult to assemble. Moreover, even in the best of such systems, the resonator surfaces do adsorb some contamination during processing.

As is well known in radiation chemistry and photochemistry, when monomers are exposed to energetic radiation, the absorption of the radiation creates radicals and ions that can precipitate the formation of polymers. An example of radiation induced polymerization in vacuum is the troublesome buildup of contamination in electron microscopes due to the electron beam polymerization of pump oil vapors.

SUMMARY OF THE INVENTION

The general object of this invention is to provide a method of reducing the aging and thermal hysteresis of quartz crystal resonators. A further object of the invention is to provide such a method while using existing fabrication equipment.

The foregoing objects can be attained by hermetically sealing the quartz crystal resonator in a housing transparent to radiation capable of polymerizing contaminants, and irradiating the resonator with radiation capable of polymerizing contaminants.

Examples of radiation capable of polymerizing contaminants include ultraviolet, electron beam, gamma ray, glow discharge, and X-ray. Of these types of radiation, the ultra violet is especially preferred because of its ease of use, ready availability, and low cost.

The housing which encloses the quartz crystal resonator must be transparent to the radiation that is capable of polymerizing the contaminants. Suitable housing materials can be made of fused quartz, sapphire, lithium fluoride, calcium fluoride, magnesium fluoride and high silica glass. Of these housing materials, the use of fused quartz or sapphire are preferred because of their high transmission of the radiation, widespread availability, and relative inertness.

The invention is believed to work because the radiation causes polymerization of hydrocarbons and other contaminants in a vacuum system or inert gas atmosphere and thereby makes the resulting polymer stable and not prone to desorption from the surface of the mounted resonator or from the inner surfaces of the housing that encloses the mounted resonator.

Part of the aging of quartz crystal resonators is due to the mass transfer of contaminants. Therefore, if the contaminants are not completely eliminated prior to sealing, the mass transfer due to the presence of contaminants in the enclosure or housing can be reduced after the hermetic seal is made if the housing is made so as to permit radiation capable of polymerizing hydrocarbons and other contaminants into the enclosure. If the hermetic seal is made in an ultrahigh vacuum or inert gas, then the radiation entering the enclosure polymerizes the contaminants present in the enclosure and prevents their subsequent desorption from the surfaces.

The polymers are deposited wherever the radiation strikes a surface. If all inside surfaces of the resonator are irradiated, then the polymerization occurs on all the inside surfaces, including the active area of the resonator. The added mass on the active area cases a downward shift in frequency. If such a shift is not desired, the shift may be minimized by directing the radiation away from the active area of the resonator.

DESCRIPTION OF THE PREFERRED EMBODIMENT

A quartz plate is mounted in clips, the clips bonded to the quartz plate, and electrodes deposited on the quartz plate to form a quartz crystal resonator according to techniques well established in the art. The quartz crystal resonator is then enclosed in a housing including a ceramic frame with fused quartz top and bottom lids. The resonator is then hermetically sealed within the housing in an oxygen free environment and the resonator then placed under an ultra violet source at about a distance of 1 centimeter so that both sides of the resonator are exposed to ultra violet radiation. In about 5 minutes, the ultra violet radiation polymerizes the contaminants causing the contaminants to be deposited onto the resonator and onto the inner walls of the housing. The contaminants then remain on the surfaces and no longer contribute to aging and thermal hysteresis. The exact time required for the polymerization to occur depends on the amount of contamination present in the enclosure, the type of contaminants present, and on the temperature of the resonator during irradiation. The temperature of the resonator is important because experiments on the photo-polymerization of monomers in a vacuum system have shown that for a given monomer pressure, the rate of polymer growth increases exponentially with decreasing temperature.

In the above embodiment, the particular ultra violet lamp used is a low pressure mercury lamp in a fused quartz envelope with an intensity at 2 centimeters from the source of 2 milliwatts per centimeter squared of radiation at 2537A and about 0.1 milliwatt per centimeters squared of radiation at 1849A. The use of other types of radiation of course will require adjustment as to the distance of the radiation source to the resonator, time of irradiation, etc. as can be easily determined by the skilled artisan.

The housing used to enclose the mounted quartz crystal resonator can be conveniently made of a frame of multilayer aluminum oxide with top and bottom lids made of fused quartz. Variations in the construction of the housing are well within the capability of one skilled in the art. Such variations might include the use of sapphire for the lids, and the replacement with fused quartz of the customary glass parts of glass enclosed crystal units. All that is essential is that at least some part of the housing be transparent to radiation capable of polymerizing contaminants inside the resonator enclosure.

Other modifications are seen as coming within the scope of the invention. For example, the inner surface of metallic housings or enclosures could be stabilized by ultraviolet as long as the feedthroughs are made of a material transparent to radiation capable of polymerizing contaminants.

When an ultraviolet lamp is used as the irradiation source, the polymerized hydrocarbons are deposited throughout the inside of the enclosure. If, however, an ultraviolet laser is directed to a spot away from the active area of the resonator and onto the package wall, then most of the hydrocarbons will deposit on the enclosure wall.

I wish it to be understood that I do not desire to be limited to the exact details of construction shown and described, for obvious modifications will occur to a person skilled in the art.

What is claimed is:

1. A method of reducing the aging and thermal hysteresis of quartz crystal resonators, said method including the steps of:
   a. hermetically sealing the quartz crystal resonator in a housing including a material transparent to ultraviolet radiation capable of polymerizing contaminants, and
   b. irradiating the contaminants within said resonator housing with ultraviolet radiation to polymerize said contaminants.

2. Method according to claim 1 wherein the resonator is hermetically sealed in an oxygen free environment.

3. Method according to claim 1 wherein said housing material transparent to radiation capable of polymerizing contaminants is selected from the group consisting of fused quartz, sapphire, lithium fluoride, calcium fluoride, magnesium fluoride, and high silica glass.

4. Method according to claim 3 wherein said housing material is fused quartz.

5. Method according to claim 3 wherein said housing material is sapphire.

6. Method according to claim 3 wherein said housing material is lithium fluoride.

7. Method according to claim 3 wherein said housing material is calcium fluoride.

8. Method according to claim 3 wherein said housing material is magnesium fluoride.

9. Method according to claim 3 wherein said housing material is high silica glass.

10. Method according to claim 1 wherein said housing material transparent to radiation capable of polymerizing contaminants is selected from the group consisting of fused quartz, sapphire, lithium fluoride, calcium fluoride, magnesium fluoride and high silica glass, and wherein said quartz crystal resonator is irradiated from a radiation source capable of polymerizing contaminants and selected from the group consisting of ultraviolet, electron beam, gamma rays, glow discharge, and X-rays.

11. Method according to claim 10 wherein said housing material transparent to radiation capable of polyerizing contaminants is fused quartz and wherein said radiation source is ultraviolet.

12. Method according to claim 1 wherein the radiation is directed to areas other than the active area of the resonator.

13. Method according to claim 1 wherein the quartz crystal resonator is cooled during irradiation.

14. Method of reducing the aging and thermal hysteresis of quartz crystal resonators, said method consisting of enclosing the quartz crystal resonator in a housing including a ceramic frame with fused quartz top and bottom lids, hermetically sealing the resonator within the housing in an oxygen free environment and irradiating the mounted quartz crystal resonator for 5 minutes with ultraviolet radiation from an ultraviolet lamp at a distance of about 1 centimeter from the resonator so that both sides of the resonator are exposed to ultraviolet radiation, and wherein the ultraviolet lamp used is a low pressure mercury lamp in a fused quartz envelope with an intensity at 2 centimeters from the source of 2 milliwatts per centimeter squared of radiation at 2537A and 0.1 milliwatt per centimeter squared of radiation at 1849A.

* * * * *